United States Patent

Kianush et al.

[11] Patent Number: 6,144,843
[45] Date of Patent: Nov. 7, 2000

[54] RECEIVER HAVING A COMMANDED-TUNING LOOP AND A SELF-TUNING LOOP

[75] Inventors: Kaveh Kianush; Johannes C. M. Meeuwis, both of Eindhoven, Netherlands

[73] Assignee: U.S. Philips Corporation, New York, N.Y.

[21] Appl. No.: 08/935,592

[22] Filed: Sep. 23, 1997

[30] Foreign Application Priority Data

Sep. 26, 1996 [EP]  European Pat. Off. ............. 96202697

[51] Int. Cl.[7] ..................................................... H04B 1/16
[52] U.S. Cl. ............................. 455/193.1; 455/192.1; 455/192.2; 455/164.2; 455/182.2; 455/183.1
[58] Field of Search ............................. 455/192.1, 192.2, 455/196.1, 164.2, 182.1, 182.2, 183.1, 183.2, 193.1

[56] References Cited

U.S. PATENT DOCUMENTS

| | | | |
|---|---|---|---|
| 4,365,349 | 12/1982 | Ogita et al. ......................... | 455/192 |
| 4,542,533 | 9/1985 | Parker ................................. | 455/164 |
| 4,715,001 | 12/1987 | Deem et al. ....................... | 364/484 |
| 5,450,621 | 9/1995 | Kianush et al. .................. | 455/192.2 |
| 5,630,215 | 5/1997 | Waldie et al. .................... | 455/192.2 |

*Primary Examiner*—Dwayne D. Bost
*Assistant Examiner*—Joy K. Redmon
*Attorney, Agent, or Firm*—Steven R. Biren

[57] ABSTRACT

In a tuning method, a commanded-tuning loop (CTL) tunes a receiver (REC) on the basis of a tuning command (TC) and a self-tuning loop (STL) tunes the receiver on the basis of a reception signal. To resolve a tuning conflict between the loops, one of the loops (CTL or STL) is calibrated (CAL) with respect to the other loop (STL or JKR CTL). Preferably, the commanded-tuning loop (CTL) is in an active state when the self-tuning loop (STL) is in-lock. This allows good reception under dynamic reception conditions.

6 Claims, 3 Drawing Sheets

RECEIVER HAVING A COMMANDED-TUNING LOOP AND A SELF-TUNING LOOP

FIELD OF THE INVENTION

The invention relates to receiver tuning by means of a commanded-tuning loop and a self-tuning loop. The commanded-tuning loop tunes the receiver on the basis of a tuning command supplied thereto. The self-tuning loop tunes the receiver on the basis of a reception signal.

BACKGROUND OF THE INVENTION

U.S. Pat. No. 5,450,621 (attorney's docket PHN 14,178) describes a prior-art receiver with two tuning loops: a tuning loop with a frequency counter for measuring the tuning frequency, and an Automatic Frequency Control (AFC) loop. In a preset mode, the tuning loop with the frequency counter provides coarse tuning. It executes a frequency comparison in respect of a digital preset code. The tuning loop with the frequency counter is "in-window" when the tuning frequency is within a certain window. The AFC loop provides fine tuning. It is "in-lock" when it has been adjusted with a given accuracy. The tuning process is completed when the tuning loop with the frequency counter is in-window, and when the AFC loop is in-lock. In that case, the power to the frequency counter can be interrupted. Before the power is interrupted, the tuning frequency is written into a last-channel memory. If correct tuning is lost, due to fading or pulling for example, the power supply to the frequency counter is restored, and the loop of which it forms part corrects tuning.

SUMMARY OF THE INVENTION

The invention seeks to provide receiver tuning of the above-identified type which, with respect to the background art, allows greater accuracy and reliability. Claim 1 defines a receiver in accordance with the invention. Claim 2 defines a method of tuning a receiver in accordance with the invention. Additional features, which may be optionally used to implement the invention to advantage, are defined in the dependent Claims.

The invention takes the following aspects into consideration. The tuning which is carried out by the commanded-tuning loop, on the one hand, and by the self-tuning loop, on the other hand, may be conflicting because, in practice, components in any of the loops suffer from tolerances, temperature-dependency and aging. For example, in the prior-art receiver the following tuning conflict may occur. The frequency to which the AFC loop wants to tune, may fall outside the window of the tuning loop with the frequency counter. In principle, this problem could be resolved by making the window sufficiently wide. However, if the window is widened, coarse tuning will become less accurate. As a result, the AFC loop may lock-in on a signal which is adjacent to the desired signal, instead of locking-in on the desired signal itself.

In accordance with the invention, one of the two loops is calibrated with respect to the other loop. Accordingly, a tuning conflict between the two loops can be resolved and, consequently, a more accurate and reliable tuning may be achieved. Furthermore, in the invention, the components of the loops do not have to meet such stringent requirements with respect to tolerance, temperature-dependency, aging, and the like, as in the prior art. Thus, the invention also allows more cost-efficient implementations than the prior art. Because, in the invention, a tuning conflict can be resolved, the commanded-tuning loop and the self-tuning loop are allowed to operate simultaneously, which provides further advantages as will be explained below.

Preferably, the commanded-tuning loop is maintained in an active state when the self-tuning loop is in-lock. This allows a receiver in accordance with the invention to perform better than the prior-art receiver under dynamic reception conditions. Under dynamic reception conditions, in mobile reception for example, strong fading and pulling effects may occur. Under such conditions, the self-tuning loop may be frequently forced out of its in-lock condition. In the prior-art receiver, the commanded-tuning loop is switched off once the self-tuning loop is in-lock, and is re-activated when a loss of in-lock is detected. Such a detection inevitably takes some time and, therefore, the commanded-tuning loop cannot immediately prevent any substantial de-tuning, but only after a certain delay.

If, as mentioned before, the commanded-tuning loop is maintained in an active state when the self-tuning loop is in-lock, the commanded-tuning loop will immediately prevent any substantial de-tuning if the self-tuning loop is forced out of the in-lock conditions. This allows the self-tuning loop to regain the in-lock state in a shorter time than in the prior-art receiver. Consequently, a momentary loss of in-lock, as well as the disturbance in reception as a result thereof, will be of shorter duration than in the prior-art receiver. Thus, this will result in a better performance under dynamic reception conditions, where the self-tuning loop may frequently be forced out of its in-lock condition. In car-radio applications, for example, the better performance may be in terms of dispensing with undesirable muting periods and/or carrying out fast, inaudible RDS updating.

Preferably, the commanded-tuning loop is calibrated with respect to the self-tuning loop. This allows a cost-efficient implementation. The reason for this is that, in most cases, calibration of the commanded-tuning loop involves adjustment of one component and/or parameter, whereas calibration of the self-tuning loop involves adjustment of several components and/or parameters.

Preferably, calibration is automatically carried out when the receiver is activated. This allows elimination of the effects of aging.

Preferably, the following three operations are carried out for calibration. First, an in-lock condition of the self-tuning loop is detected. Second, the frequency to which the receiver is tuned is measured. And third, a correction value is determined by comparing the measured tuning frequency with the nearest tuning frequency which the commanded-tuning loop could have nominally reached. This allows cost-efficient implementations. The reason for this is as follows. In many cases, there is an accurate relation between a tuning command and the tuning frequency which the commanded-tuning loop will produce on the basis of this tuning command. In those cases, the nearest tuning frequency which the commanded-tuning loop could have nominally reached, may therefore be directly derived from a set of possible tuning commands. Thus, the commanded-tuning loop need not be activated during the calibration.

The invention and additional features, which may optionally be used to implement the invention to advantage, will be apparent from and elucidated with reference to the drawings described hereinafter.

BRIEF DESCRIPTION OF THE DRAWINGS

In the drawings.

Like elements are denoted by like reference signs throughout the drawings.

DESCRIPTION OF THE PREFERRED EMBODIMENTS

Figure 1:
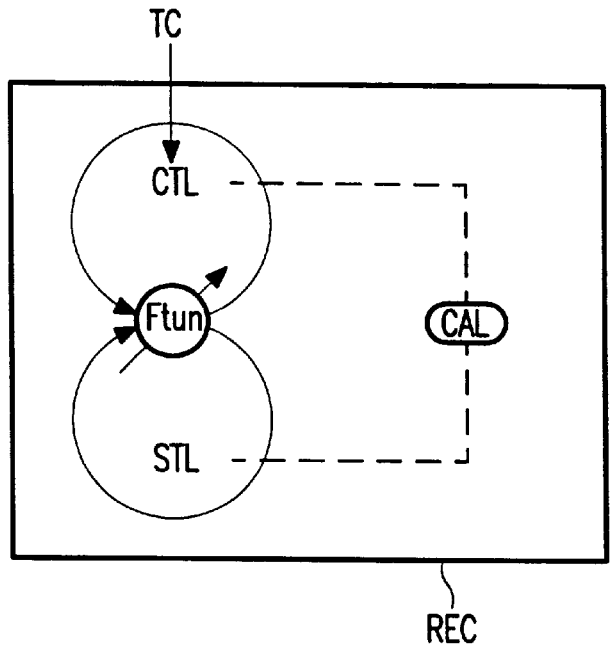
FIG. 1 illustrates, in an abstract diagram, the basic principles of the invention.

FIG. 1 illustrates the basic principles of the invention. In FIG. 1, a receiver REC comprises a commanded-tuning loop CTL and a self-tuning loop STL. Both loops may change the tuning frequency Ftun of the receiver REC. The commanded tuning-loop CTL strives to set the tuning frequency Ftun in accordance with a tuning command TC supplied thereto. In a calibration CAL, one of the two loops is calibrated with respect to the other loop. Accordingly, a tuning conflict between the two loops can be resolved. For example, after the calibration CAL, the commanded-tuning loop CTL may tune to frequencies for which the self-tuning loop STL will be in-lock or at least close to in-lock.

Figure 2A:
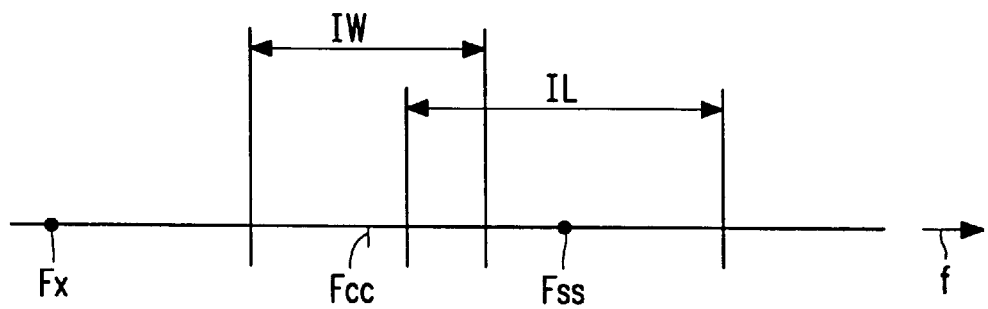
FIGS. 2a and 2b show, in a frequency diagram, examples of tuning characteristics prior to calibration and after calibration, respectively.
Figure 2B:
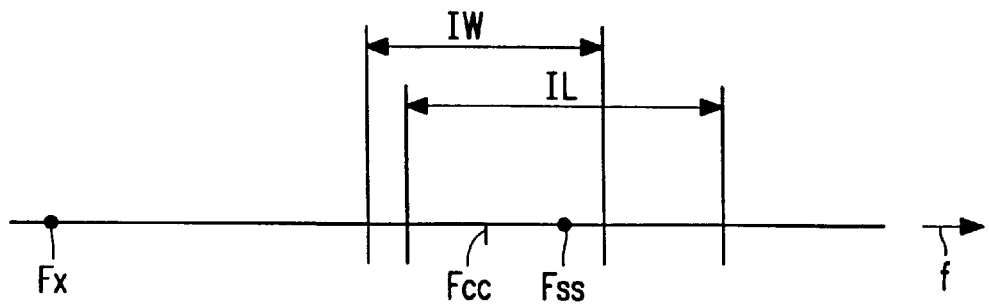

FIGS. 2a and 2b show examples of tuning characteristics prior to calibration and after calibration, respectively. The FIGS. 2a and 2b tuning characteristics apply when the commanded-tuning loop CTL and the self-tuning loop STL are implemented as equivalents of the loops employed in U.S. Pat. No. 5,450,621 (attorney's docket PHN 14,178), which is incorporated herein by reference together with any co-pending applications. It should be noted, however, that the commanded-tuning loop CTL and the self-tuning loop STL may be implemented in a different manner. For example, the commanded-tuning loop may be implemented as a phase-lock frequency synthesizer rather than a frequency-lock synthesizer.

In the FIGS. 2a and 2b tuning characteristics, there is an in-window frequency range IW centered around a center frequency Fcc. Within this range the commanded-tuning loop does not affect the tuning frequency Ftun. There is also an in-lock frequency range IL within which the self-tuning loop STL is considered to be in-lock. Furthermore, there is also a desired steady-state frequency Fss and an undesired steady-state frequency Fx, at both of which the self-tuning loop STL is in a steady-state. The undesired steady-state frequency Fx may be due to an adjacent channel signal, for example.

FIG. 2a shows tuning characteristics when no calibration has been carried out yet. In FIG. 2a, the overlap between the in-window frequency range IW and the in-lock frequency range IL is relatively small due to component spread, for example. Consequently, the commanded-tuning loop CTL may very well tune to a frequency at which the self-tuning loop STL is not in-lock. It may even happen that the commanded-tuning loop CTL tunes to the lower extreme frequency of the in-window frequency range IW. This frequency is closer to the undesired steady-state frequency Fx than to the desired steady-state frequency Fss. There is a risk that the self-tuning loop STL tunes to the undesired steady-state Fx instead of to the desired steady-state frequency Fss. Furthermore, in FIG. 2a, the desired steady-state frequency Fss is outside the in-window frequency range IW. This tuning conflict does not allow the commanded-control loop CTL and the self-tuning loop STL to operate simultaneously.

FIG. 2b shows tuning characteristics when one of the two loops is calibrated with respect to the other loop. In FIG. 2b, the in-window frequency range IW and the in-lock frequency range IL substantially overlap. Consequently, there is a smaller chance than in FIG. 2a that the commanded-tuning loop CTL tunes to a frequency at which the self-tuning loop STL is not in-lock. Furthermore, in FIG. 2b, the lower extreme frequency of the in-window frequency range IW is closer to the desired steady-state frequency Fss than to the undesired steady-state frequency Fx. Consequently, in FIG. 2b, there is a smaller risk than in FIG. 2a that the self-tuning loop STL tunes to the undesired steady-state Fx instead of to the desired steady-state frequency Fss. Furthermore, in FIG. 2b, the desired steady-state frequency Fss is inside the in-window frequency range IW. Thus, the tuning conflict of FIG. 2a has been resolved and, consequently, the commanded-control loop CTL and the self-tuning loop STL may operate simultaneously. If they operate simultaneously, the commanded-tuning loop CTL is capable of preventing any tuning to the undesired steady-state Fx whatsoever.

Figure 3:
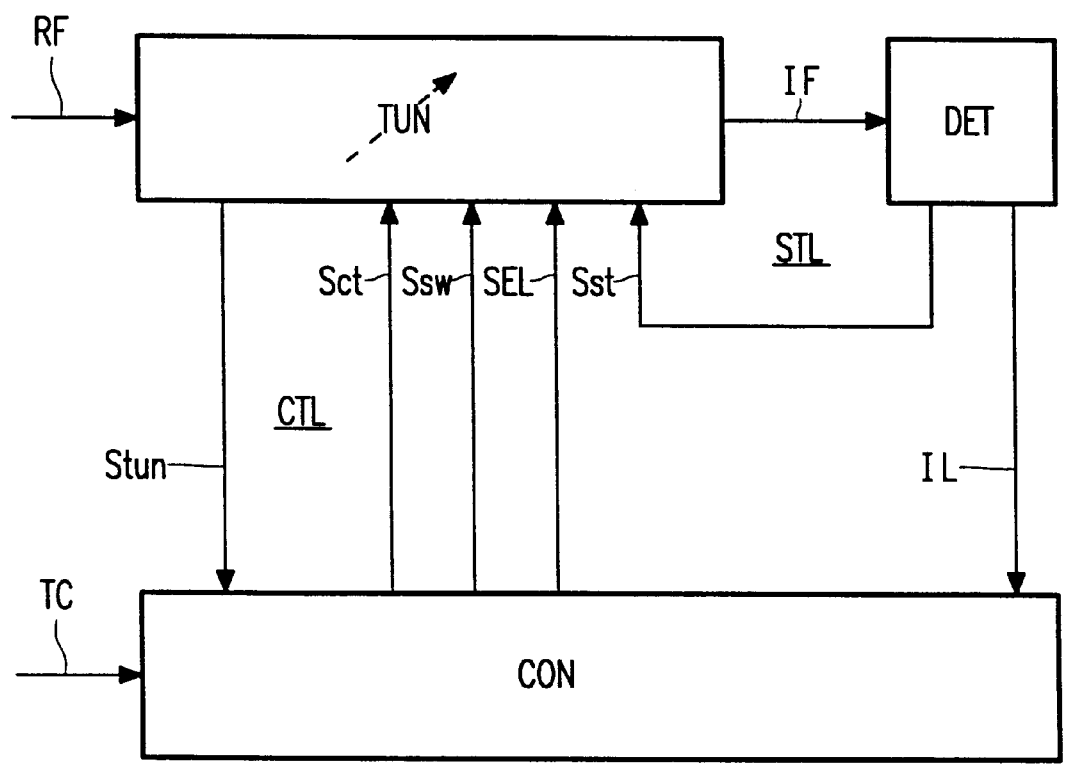
FIG. 3 shows, in a block diagram, an example of a receiver in accordance with the invention.

FIG. 3 shows an example of a receiver in accordance with the invention. The FIG. 3 receiver comprises the following main parts: a tuner TUN a detector DET and a controller CON. The tuner TUN converts a receiver input signal RF into an intermediate frequency signal IF. If the tuner TUN is tuned to a desired reception signal, the intermediate frequency signal IF will mainly comprise a frequency-shifted version of the desired reception signal. A set of signals which control the tuner TUN, include a commanded-tuning signal Sct, a self-tuning signal Sst, a sweep-tuning signal Ssw, and a control-selection signal SEL. The control-selection signal SEL determines which of the aforementioned tuning signals may control the tuner TUN.

The detector DET provides the self-tuning signal Sst in response to the intermediate frequency signal IF. The self-tuning signal Sst varies as a function of the frequency of the frequency-shifted version of the desired reception signal, if any. Thus, the detector DET forms, together with the tuner TUN, a self-tuning loop STL which tunes the receiver on the basis of the desired reception signal. The detector DET also provides an in-lock signal IL which indicates whether or not the self-tuning loop STL may reach in-lock when it is not yet in-lock.

The controller CON provides the commanded-tuning signal Sct, the sweep-tuning signal Ssw, and the control-selection signal SEL. The controller CON receives a signal Stun from the tuner TUN, which signal is indicative of the tuning frequency Ftun of the tuner TUN. The controller also receives a tuning command TC which it compares with the tuning frequency Ftun of the tuner TUN. The commanded-tuning signal Sct varies as a function of this comparison. Thus, the controller CON forms, together with the tuner TUN, a commanded-tuning loop which tunes the receiver on the basis of the tuning command TC. The sweep-tuning signal Ssw is used to carry out a frequency sweep over the frequency band of interest or, at least, a portion thereof. The role of the control-selection signal SEL will be described in greater detail hereinafter with reference to FIG. 4.

Figure 4:
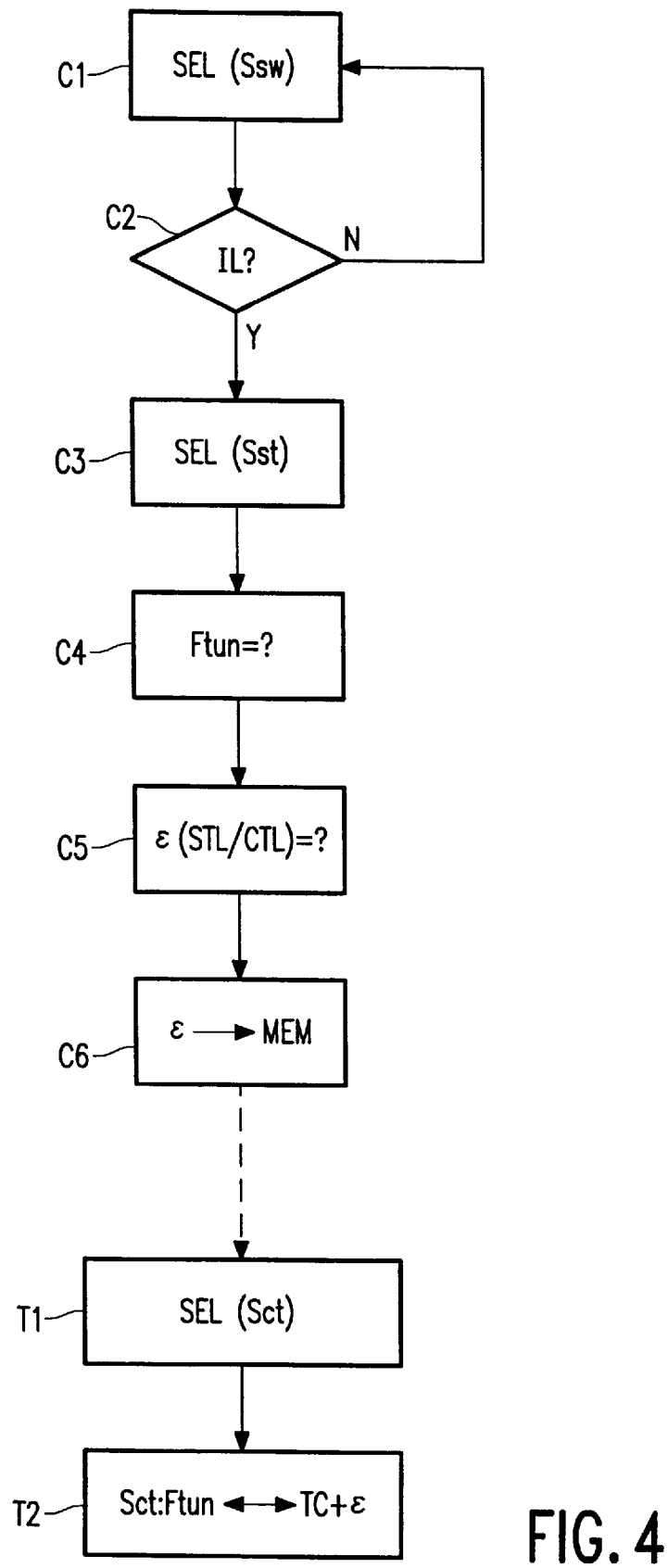
FIG. 4 shows, in a flow chart, an example of tuning the FIG. 3 receiver in accordance with the invention.

FIG. 4 shows an example of a method of tuning the FIG. 3 receiver. In FIG. 4, two types of steps are shown: calibration steps C1–C6 and tuning steps T1,T2. The calibration steps C1–C6 are carried out when the FIG. 3 receiver is in a calibration mode. The tuning steps T1,T2 are carried out when the FIG. 3 receiver is in a tuning mode.

In calibration step C1, the control-selection signal SEL selects the sweep-tuning signal Ssw for controlling the tuner TUN. Meanwhile, in calibration step C2, the controller CON checks if the self-tuning loop STL is in-lock or not. If it is not in-lock, the sweep-tuning signal Ssw continues to control the tuner TUN. However, if it is in-lock, calibration step C3 is carried out in which the control-selection signal SEL selects the self-tuning signal Sst, instead of the sweep-tuning signal Ssw, for controlling the tuner TUN.

The effects of the calibration steps C1–C3 are the following. At the beginning of the calibration mode, the tuner TUN starts to sweep the frequency band of interest or, at least, a portion thereof. This continues until the detector DET indicates that there is a frequency-shifted version of a reception signal at the input of the detector DET, for which signal the self-tuning loop STL may reach in-lock. In that case, the tuner TUN stops sweeping and is further controlled by the self-tuning signal Sst provided by the detector DET. Thus, the self-tuning loop STL will lock-in into this signal and reach a steady state.

In calibration step C4, the controller CON determines the tuning frequency Ftun of the tuner TUN when the self-tuning loop STL has locked-in into the signal found during the above-described sweep. In calibration step C5, the tuning frequency Ftun is compared with the nearest tuning frequency which the tuner TUN would nominally have reached if it had been tuned with the commanded-tuning loop CTL. Accordingly, in calibration step C5 a correction value $\epsilon$ is obtained as a result of this comparison. In calibration step C6, the correction value $\epsilon$ is stored in a memory which, although not shown in FIG. 3, may form part of the controller CON, for example.

When calibration steps C1–C6 have been completed, the FIG. 3 receiver may switch from the calibration mode to the tuning mode. In the tuning mode, tuning step T1 is carried out in which the control-selection signal SEL selects the commanded-tuning signal Sct for controlling the tuner TUN. In addition, the self-tuning signal Sst may or may not be selected. In tuning step T2, the controller CON corrects the tuning command TC with the correction value $\epsilon$, and compares the tuning frequency Ftun of the tuner TUN with the corrected tuning command. The commanded-tuning signal Sct varies as a function of this comparison.

The effects of tuning steps T1 and T2 are the following. The commanded-tuning loop CLT will set the tuning frequency Ftun of the tuner TUN in accordance with the corrected tuning command. Depending on the correction value $\epsilon$, this tuning frequency will differ from that which would have been obtained if the tuning command TC had not been corrected. The correction value $\epsilon$ effectively offsets the commanded-tuning loop CLT such that it brings the tuning frequency Ftun of the tuner TUN to a value for which the self-tuning STL loop is in-lock or, at least, close to in-lock. If, in tuning step T1, the self-tuning signal Sst has been selected too, the tuner TUN will be further tuned such that the self-tuning loop STL reaches a desired steady-state condition. If, in tuning step T1, the self-tuning signal Sst has not been selected, this signal may be selected in a further tuning step, subsequent to tuning step T2, to effect the same.

An FM-radio application of the FIG. 4 method is given here below by way of illustration. It is assumed that the FIG. 3 receiver, which is tuned in accordance with the FIG. 4 method, is an FM-radio receiver with the following features. The tuner TUN comprises a mixer-oscillator combination for frequency-shifting a desired reception signal to a nominal intermediate frequency of 10.7 MHz. However, the components defining the intermediate frequency suffer from tolerances, temperature-dependency and aging. Therefore, in the FM-radio receiver, the components defining the intermediate frequency are tuned to 10.715 MHz, for example, instead of 10.7 MHz.

In the calibration mode, which begins with calibration step C1, the FM-radio receiver starts to sweep the FM-radio band at, for example, 87.5 MHz. The sweep continues until, in calibration step C2, a station is found at 89.3 MHz, for example. In calibration step C3, the self-tuning loop STL reaches a steady state for the station found at the intermediate frequency of 10.715 MHz. The FM-radio receiver is now satisfactorily tuned to the station at 89.3 MHz. In calibration step C4, the frequency of the oscillator in the mixer-oscillator combination is measured by means of a frequency counter in the controller CON. Assuming that the oscillator frequency is higher than that of the desired reception signal, the frequency counter will measure the frequency of 100.015 MHz. Assuming that tuning commands TC are provided for a grid of 100 kHz and, of course, for the nominal intermediate frequency of 10.7 MHz, the nearest oscillator frequency which the commanded-tuning loop would have produced, if it had been tuned for the same station, is 100.000 MHz. In calibration step C5, the difference between the measured frequency of 100.015 MHz and the aforementioned nearest oscillator frequency is determined, which difference is +0.015 MHz (15 kHz). This difference of 15 kHz is stored, in an appropriate form, in the controller CON as the correction value $\epsilon$.

For the tuning mode, it is assumed that reception of a station at 90 MHz is desired. To that end, the commanded-tuning CTL loop is activated, in tuning step T1, and a "90 MHz-reception" tuning command TC is supplied to the commanded-tuning loop CTL. In tuning step T2, the controller CON corrects the "90 MHz-reception" tuning command TC by using the correction value $\epsilon$ to obtain a corrected "90 MHz-reception" tuning command. On the basis of the corrected "90 MHz-reception" tuning command, the commanded-tuning loop will tune the oscillator to approximately 100.715 MHz. Accordingly, the mixer-oscillator combination in the tuner TUN will frequency-shift the desired station to approximately 10.715 MHz which is the same frequency as to which the components defining the intermediate frequency are tuned. Thus, the commanded-tuning loop CTL will tune the FM-radio receiver such that the self-tuning loop STL is relatively near to its desired steady state. For comparison, if the commanded-tuning loop CLT had not been calibrated with respect to the self-tuning loop STL as described above, the mixer-oscillator combination would have frequency-shifted the desired station to 10.7 MHz, which is relatively far from the desired steady state of the self-tuning loop.

The above-described examples illustrate rather than limit the invention. Evidently, there are numerous alternatives which fall within the scope of the appended Claims. The following closing remarks are made in that connection.

Referring to the FIG. 3 receiver, the sweep-tuning signal Ssw is not essential to the invention. The only thing that matters is that the self-tuning loop STL reaches a steady-state for an arbitrary reception signal. The sweep-tuning signal Ssw is merely used to facilitate this.

There are numerous ways of physically spreading functions or functional elements over various units. In this respect, FIG. 3 is very diagrammatic and represents only one possible embodiment of a receiver in accordance with the invention. For example, the sweep-tuning signal Ssw, the commanded-tuning signal Sct and the self-tuning signal Sst need not be separate, and may be multiplexed.

Whilst the invention can be used to great advantage in mobile receivers, such as car-radios, applications in stationary receivers, such as home TV-sets and VCRs, are by no means excluded.

Any reference signs between parentheses shall not be construed as limiting the claim concerned.

What is claimed is:

1. Receiver comprising a commanded-tuning loop (CTL) and a self-tuning loop (STL), characterized in that the receiver comprises means (CON) for calibrating (C1–C6) one of the two loops (CTL or STL) with respect to the other loop (STL or CTL), the two loops having operating ranges which at least partly overlap, and means for maintaining the commanded-tuning loop (CTL) in an active state when the self-tuning loop (STL) is in-lock.

2. Method of tuning a receiver which comprises a commanded-tuning loop (CTL) and a self-tuning loop (STL), characterized in that the method comprises the step of calibrating (C1–C6) one of the two loops (CTL or STL) with respect to the other loop (STL or CTL), the two loops having operating ranges which at least partly overlap, and the step of maintaining the commanded-tuning loop (CTL) in an active state when the self-tuning loop (STL) is in-lock.

3. Method of tuning a receiver as claimed in claim 2, characterized in that the commanded-tuning loop (CTL) is calibrated with respect to the self-tuning loop (STL).

4. Method of tuning a receiver as claimed in claim 2, characterized in that the calibrating step (C1–C6) is automatically carried out when the receiver is activated.

5. Method of tuning a receiver as claimed in claim 2, characterized in that the method comprises the steps of:

detecting (C2) an in-lock condition of the self-tuning loop (STL);

measuring (C4) the frequency to which the receiver is tuned to obtain a measured tuning frequency; and deriving (C5) a correction value ($\epsilon$) by comparing the measured tuning frequency with the nearest tuning frequency which the commanded-tuning loop (CTL) could nominally have reached.

6. Method of tuning a receiver as claimed in claim 5, characterized in that the method comprises the step of sweeping (C1) a frequency band of interest or, at least, a portion thereof, after which sweeping step (C1) the detecting step (C2), the measuring step (C4) and the deriving step (C5) are carried out.

* * * * *